(12) United States Patent
Ma et al.

(10) Patent No.: US 6,809,617 B2
(45) Date of Patent: Oct. 26, 2004

(54) EDGE PLATED TRANSMISSION LINE AND SWITCH INTEGRALLY FORMED THEREWITH

(75) Inventors: Qing Ma, San Jose, CA (US); Joseph Hayden, III, Sunnyvale, CA (US); Tsung-Kuan Allen Chou, San Jose, CA (US); Quan Tran, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/322,157

(22) Filed: Dec. 17, 2002

(65) Prior Publication Data

US 2004/0113725 A1 Jun. 17, 2004

(51) Int. Cl.$^7$ ............................... H01P 3/08; H01P 1/10
(52) U.S. Cl. ....................................... 333/238; 333/105
(58) Field of Search ............................... 333/238, 246, 333/105

(56) References Cited

U.S. PATENT DOCUMENTS

| | | | |
|---|---|---|---|
| 5,834,995 A | * | 11/1998 | Richards et al. ............ 333/238 |
| 6,041,245 A | | 3/2000 | Mansour ..................... 505/210 |
| 6,045,932 A | | 4/2000 | Jia et al. |
| 6,426,687 B1 | * | 7/2002 | Osborn .................. 333/105 X |
| 6,466,102 B1 | | 10/2002 | Grant et al. |
| 2001/0045876 A1 | | 11/2001 | Kawahara et al. |

FOREIGN PATENT DOCUMENTS

| EP | 0 917 236 A2 | 5/1999 |
|---|---|---|
| JP | 2003218610 | 7/2003 |

OTHER PUBLICATIONS

U.S. patent application Publication US 2002/0135444 A1 published Sep. 26, 2002 Ida et al, Filing Date Jan. 29, 2002.*

* cited by examiner

Primary Examiner—Benny Lee
(74) Attorney, Agent, or Firm—Kevin A. Reif

(57) ABSTRACT

Coplanar waveguides have a center signal line and a pair of ground lines on either side formed of a sputtered material such as gold (Au). Such waveguides are subject to what is known as the edge effect at high frequency operation causing currents to concentrate and flow along adjacent edges of the lines. Providing a thicker plated layer only on adjacent edges of the lines provide substantial performance improvements over sputtered lines alone while saving significant amount of Au, thus reducing costs.

12 Claims, 6 Drawing Sheets

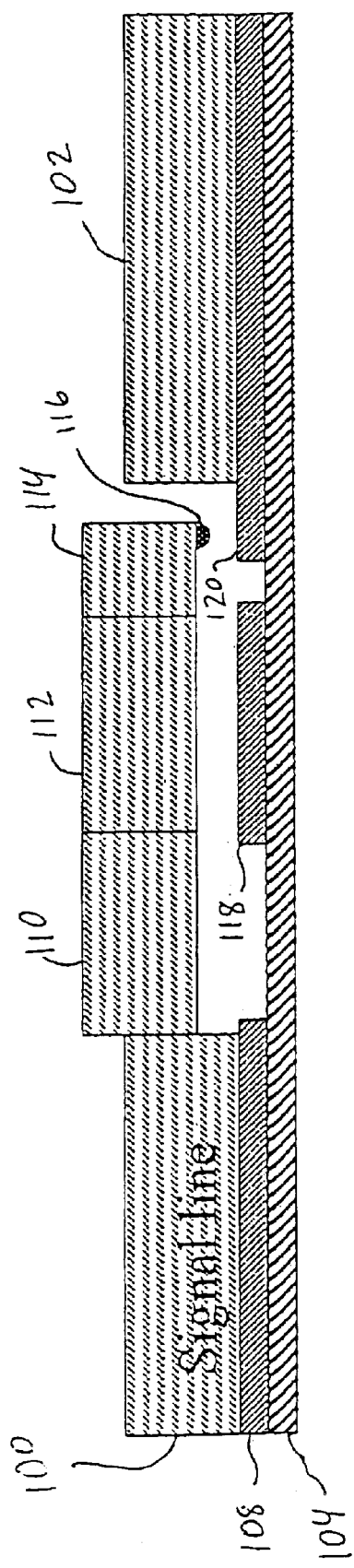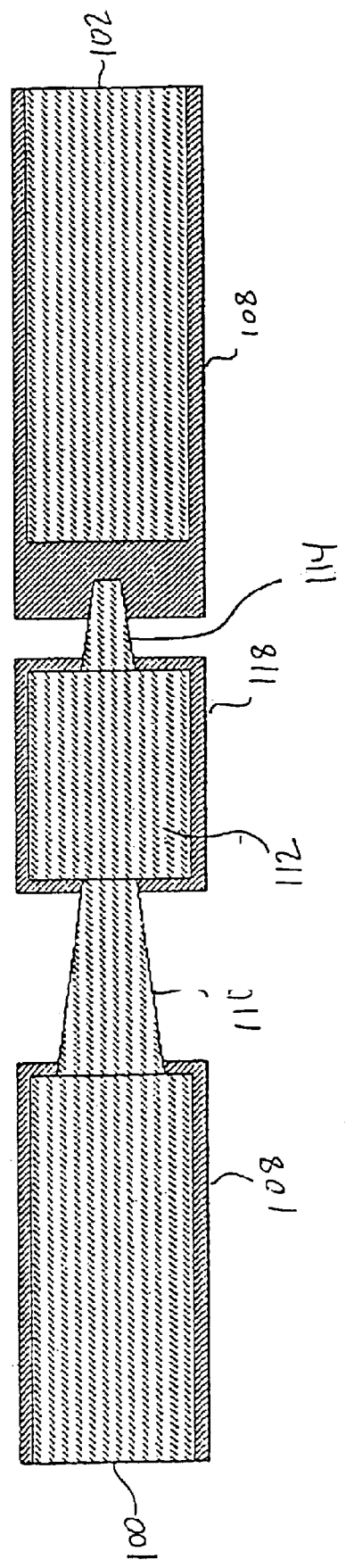

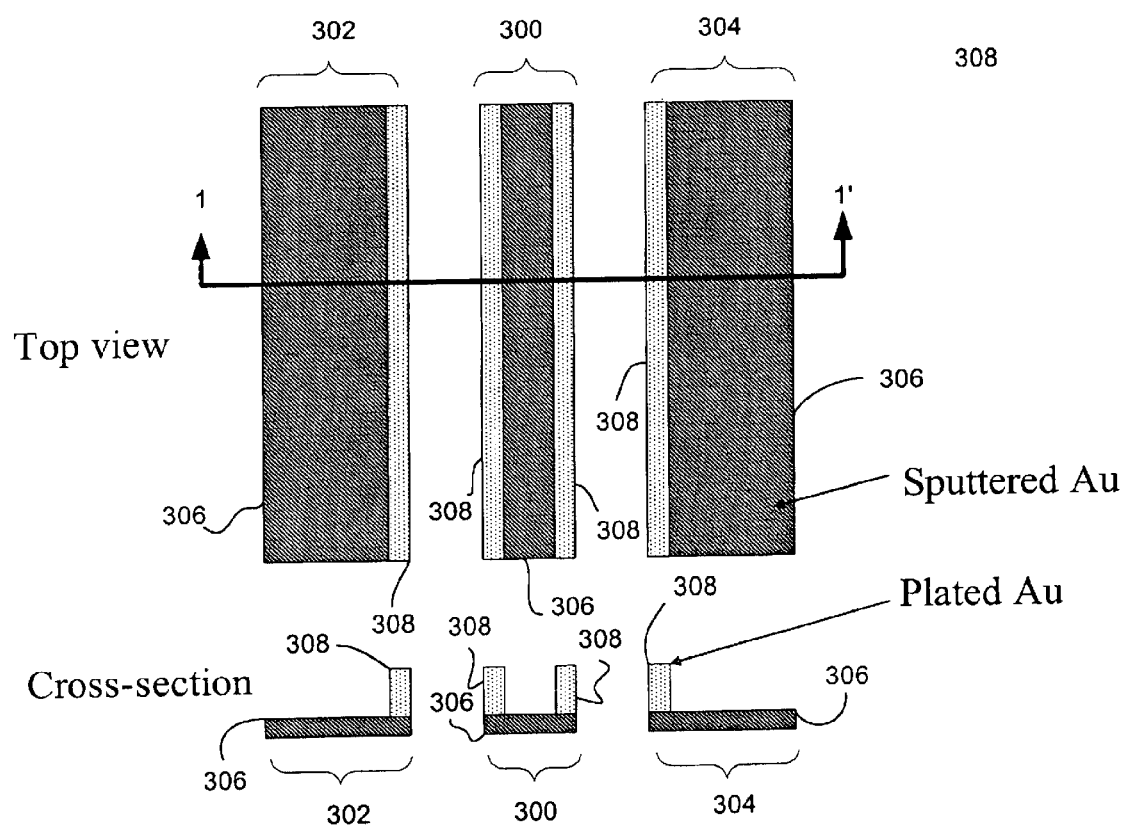

US 6,809,617 B2

EDGE PLATED TRANSMISSION LINE AND SWITCH INTEGRALLY FORMED THEREWITH

FIELD OF THE INVENTION

Embodiments of the invention relate to transmission lines and, more particularly, to reducing the amount of conductive material in transmission lines used in high-frequency (RF) applications.

BACKGROUND INFORMATION

It is well know that as the frequency of an electrical signal increases, the RF (radio frequency) energies tend to concentrate near the surface or skin of the conductor medium. The higher the frequency, the thinner the conduction layer under the conductor surface. There are techniques employed to mitigate this phenomena such as using stranded wire instead of a solid conductor to increase the effective surface area of the conductor.

This phenomena is caused by the self-inductance of the conductor. All alternating current flow has associated therewith electrical fields and corresponding magnetic fields that influence the carriers (electrons) and tend to force them to the surface of the conductor. The higher the frequency, the greater the force towards the surface. This is most pronounced in RF applications. This phenomena causes increased effective resistance of a conductor for alternating currents (AC) at higher frequencies as compared with the resistance of the same conductor with a direct current (DC) or a current of lower AC frequencies.

For these reasons, among others, simple interconnections between electronic devices operating in high frequency ranges (i.e., giga-hertz) cannot be effectively used. Instead, signals are carried via waveguide devices such as coplanar waveguides or micro strip devices. In the case of coplanar waveguides, parallel conducting lines patterned on a dielectric surface are used to carry signals. However, just as described above, at high frequencies current tends to move along the surface of the conductors. In addition, due to the geometries of the parallel conducting lines, current tends to concentrate along adjacent edges of the conductors. This is sometimes referred to as the "edge effect".

BRIEF DESCRIPTION OF THE DRAWINGS

FIG. 2A is a side view of a waveguide signal line including an integrated switch;

FIG. 2B is a top view of the waveguide signal line and integrated switch shown in FIG. 2A;

FIG. 3A shows a top view of the inventive edge plated waveguide;

FIG. 3B shows a cross-section of the edge plated waveguide shown in FIG. 3A taken along line 1—1';

DETAILED DESCRIPTION OF THE INVENTION

Transmission lines such as coplanar waveguides are used in modern high frequency applications to carry signals from one electronic circuit to another. These waveguide devices may also included mechanical switches integral with the waveguide device for controlling the flow of signal current. For conductivity reasons, the transmission lines are plated with a thick conductor material such as gold (Au). However, plating thick transmission lines consumes significant amounts of conductor material. In fact, for a multi-band switch module, it is estimated that more than 80% of the conductor material consumed is used for the transmission lines. The individual switches consume only a small fraction of the conductor material.

Since the cost of the conductor material may be a significant part of the total cost, reducing the amount of conductor material used is desirable in order to reduce the cost of the waveguide. However, the amount of materials used to form the switches are substantially determined by mechanical and processing constraints and for that reason may not be easily reduced. Thus, embodiments of the present invention provide geometries designed to reduce the amount of conductor material used for the transmission lines themselves without appreciable loss of signal transmission quality.

Figure 1:
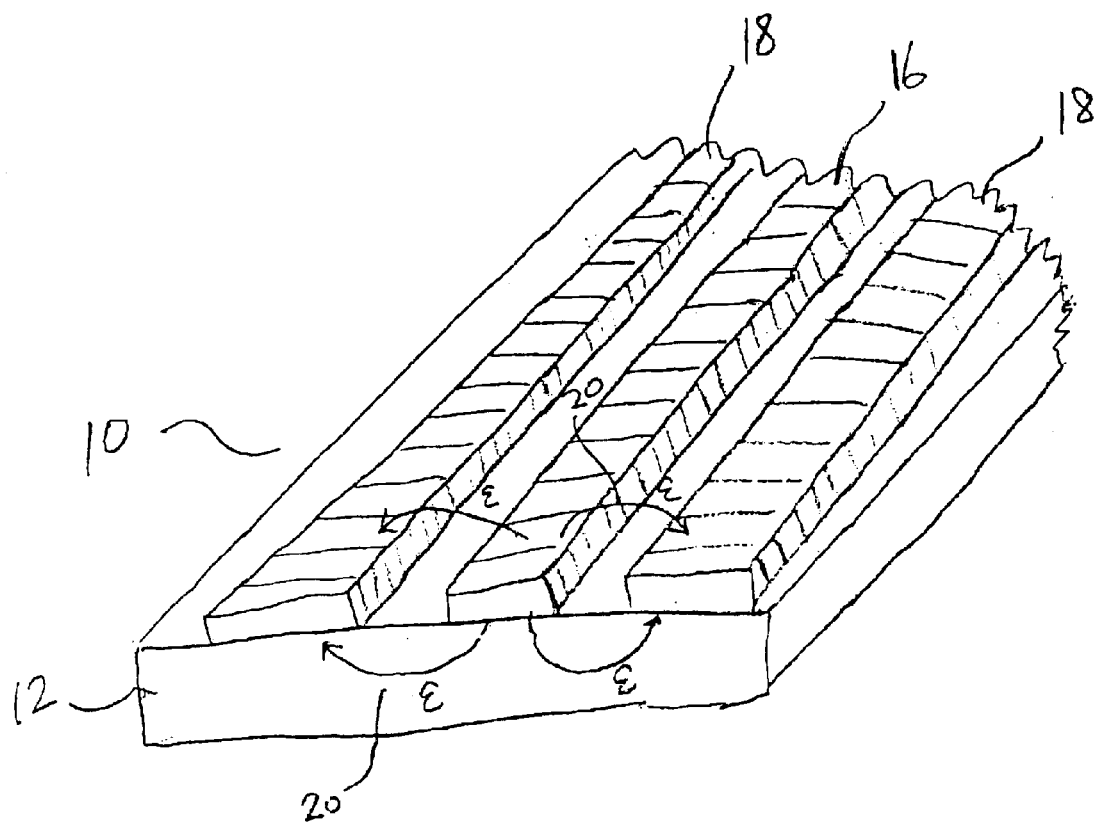
FIG. 1 is a plan drawing of a conventional coplanar waveguide.

FIG. 1 shows a coplanar waveguide 10, a type of transmission device used in high frequency electronic applications. In one embodiment, three conducting metal strips are fashioned in parallel on a dielectric substrate layer 12 spaced equidistance apart. Traditionally, these strips comprise a thick layer of conducting material such as Au. The center strip may be referred to as the signal line 16 and the outer two strips as the ground lines 18 according to one embodiment. As previously mentioned, at high frequency operation, current carried in the waveguide 10 tends to concentrate not just along the skin of the transmission lines, but along adjacent edges of the transmission lines. This is sometimes referred to as the "edge effect" and may additionally be influenced by the electrical and magnetic fields illustrated by the E-field vectors 20 tending to influence the current towards the adjacent edges of the conductors 16 and 18.

Throughout the specification, the same reference numerals may be used in different drawings to identify the same or similar elements. Referring now to FIGS. 2A and 2B, coplanar waveguides may include cantilever switches such as those made by MEMs (Micro Electro Mechanical system) fabrication techniques. These switches may be fabricated in series with the center signal line 100 (16 in FIG. 1) to make or break signal connections traveling through the waveguide. FIG. 2A shows a side view of such a cantilevered switch, while FIG. 2B shows the top view of the same switch.

The switch comprises a broken signal line 100 and 102 patterned on a substrate 104. A bottom metal layer 108, such as Au, may be patterned over the dielectric layer 104 (FIG. 2A). A cantilevered beam 110 projects outward from the first portion of the signal line 100 bridging the space between the first portion of the signal line 100 and the second portion of the signal line 102. The cantilevered beam 110 may comprise a center portion 112 and a tip portion 114. The tip portion 114 may include a conductive bump (bottom electrode) 116 (FIG. 2A) on its underside. In operation, an actuation voltage is applied to a pad 118 beneath the center portion 112 of the cantilevered beam. This voltage 110 causes the cantilevered beam 110 to be pulled downward such that the electrode 116 makes electrical contact with an exposed portion 120 (FIG. 2A) of the bottom metal layer 108. As such, an electrical circuit is closed and signals can freely flow between the first portion of the signal line 100 and the second portion of the signal line 102.

The MEMs switch shown in FIGS. 2A and 2B is simple to manufacture. The thickness of the bottom metal layer 108, the thickness of the bottom electrode 116 and the thickness and the beam 110 are substantially determined by mechanical and processing constraints. These thicknesses are in most cases not easily reduced. Typically, the bottom electrode 118 is <1 um in thickness, and the beam 110 thickness is >5 um.

One embodiment of the present invention is directed to reducing the amount of conductor material used in the manufacture of the signal and ground lines of a waveguide. Referring to FIGS. 3A and 3B, FIG. 3A shows a top view of the inventive waveguide and FIG. 3B shows a cross-section of the transmission lines taken along line 1—1'. As shown, the coplanar waveguide comprises three conductor lines 300, 302, and 304 arranged in parallel, spaced approximately equidistance apart. The width of the center conductor 300 and the gap between the lines determines the impedance of the waveguide. These geometries depend on the dielectric constant of the underlying substrate. The center transmission line is the signal line 300 and the two transmission lines on either side are the ground lines 302 and 304. Each of the transmission lines 300, 302, and 304 comprise a first thin sputtered or evaporated conductor layer 306, such as gold (Au). Atop each of the thin layers is a second, thicker plated conductor layer 308, which may also be Au. Of course Au is not the only material that may be used. For example, Aluminum (Al), Nickel (Ni), Copper (Cu), alloys thereof, or any other conductor material commonly used as waveguide conductors may be used.

The thicker plated conductor layer 308 is only plated along adjacent edges of the sputtered Au layer 306. As shown in FIG. 3B, the cross-section of the edge plated signal line 300 may have a U-shape made up of the conducting base layer 306 and two vertical conducting edge portions 308 made of the thicker, plated material. Similarly, the two ground planes, 302 and 304, may have L-shaped cross-sections made up again of the conducting base layer 306. However, each ground plane 302 and 304 may have only one vertical conducting edge portion 308 on an edge adjacent to the signal line 300. Since at high frequencies currents tend to concentrate at the transmission line edges, a significant amount of conductor material can be saved by plating only the edges 308 of the transmission lines without any appreciable loss of performance.

Figure 4A:
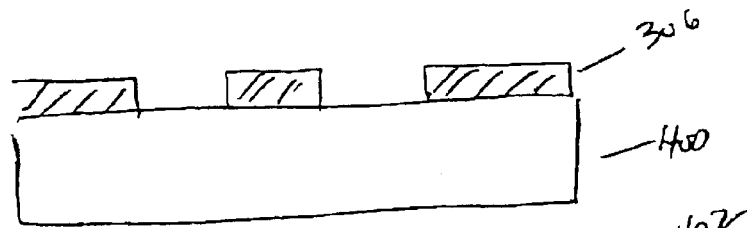
FIGS. 4A–4D are diagrams showing the edge plated waveguide during exemplary processing steps.
Figure 4B:
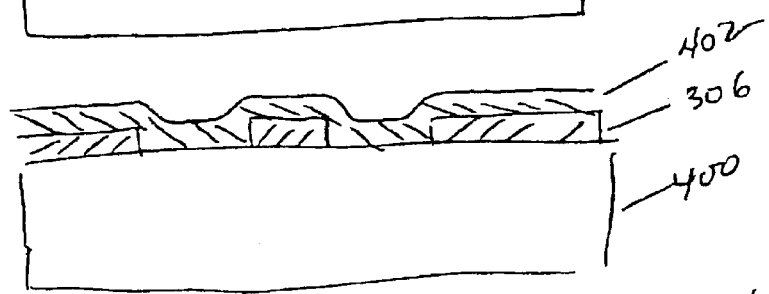

FIGS. 4A, 4B, 4C, and 4D show a process flow for producing the waveguide edge plated transmission lines. Of course this is offered as an example since there are many other ways such lines could be manufactured. As shown in FIG. 4A, the bottom conductor layer 306 for the conductor lines, such as Au, Ni, or Cu, is deposited such as by sputtering or evaporation on a dielectric substrate 400. The dielectric substrate 400 may be SiO2. or some other appropriate material. This bottom conductor layer 306 may be approximately 0.2–0.5 µm thick. In FIG. 4B, the bottom conductor layer 306 over the substrate 400 is covered by a "seed layer" 402 which provides electrical conductivity across the wafer for a subsequent electroplating process. This seed layer 402 may be approximately 0.1–0.2 µm thick.

Figure 4C:
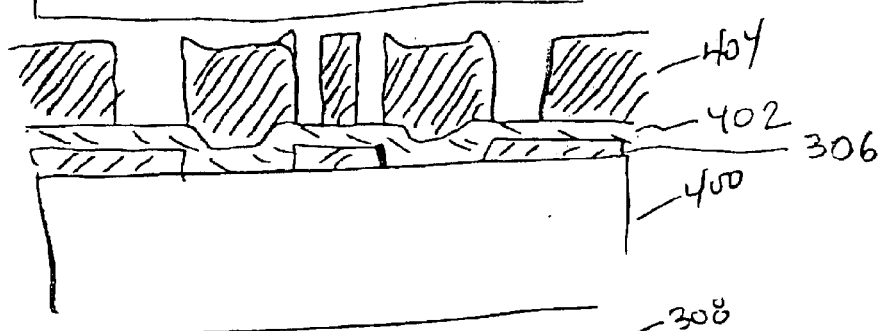
Figure 4D:
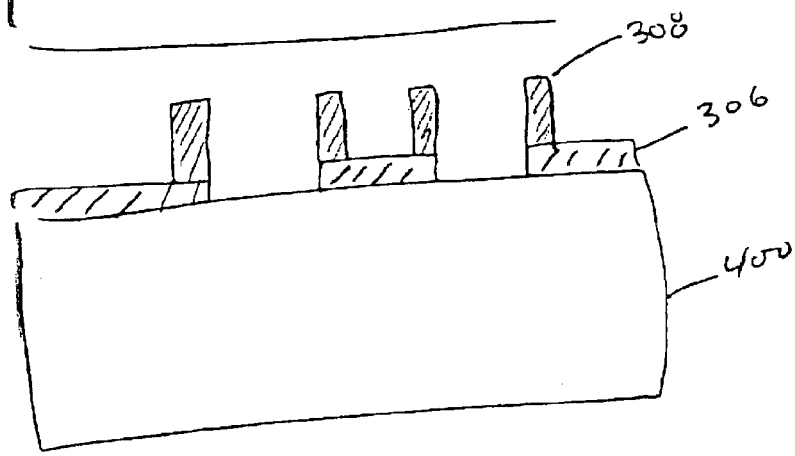

Next, referring to FIG. 4C, a patterned resist 404 is deposited as a mold for the edge plating. In FIG. 4D, a thicker layer of conductor material 308 (e.g., Au, Ni, or Cu) may be deposited, such as by a plating process, and fills the exposed areas over the adjacent edges of the bottom conductor layer 306. The thicker, plated layer 308 may be made several skin depths thick (e.g., 5 µm at 2 GHz).

The resist 404 is then removed along with the seed layer 402. As shown in FIG. 4D, the result may be three co-planar conducting lines comprising a signal line 300, and a pair of ground lines 302 and 304 spaced substantially equidistance apart on either side of the signal line 300. Of course the width of the edge plating is easily controlled by the placement of the resist 404.

Figure 5:
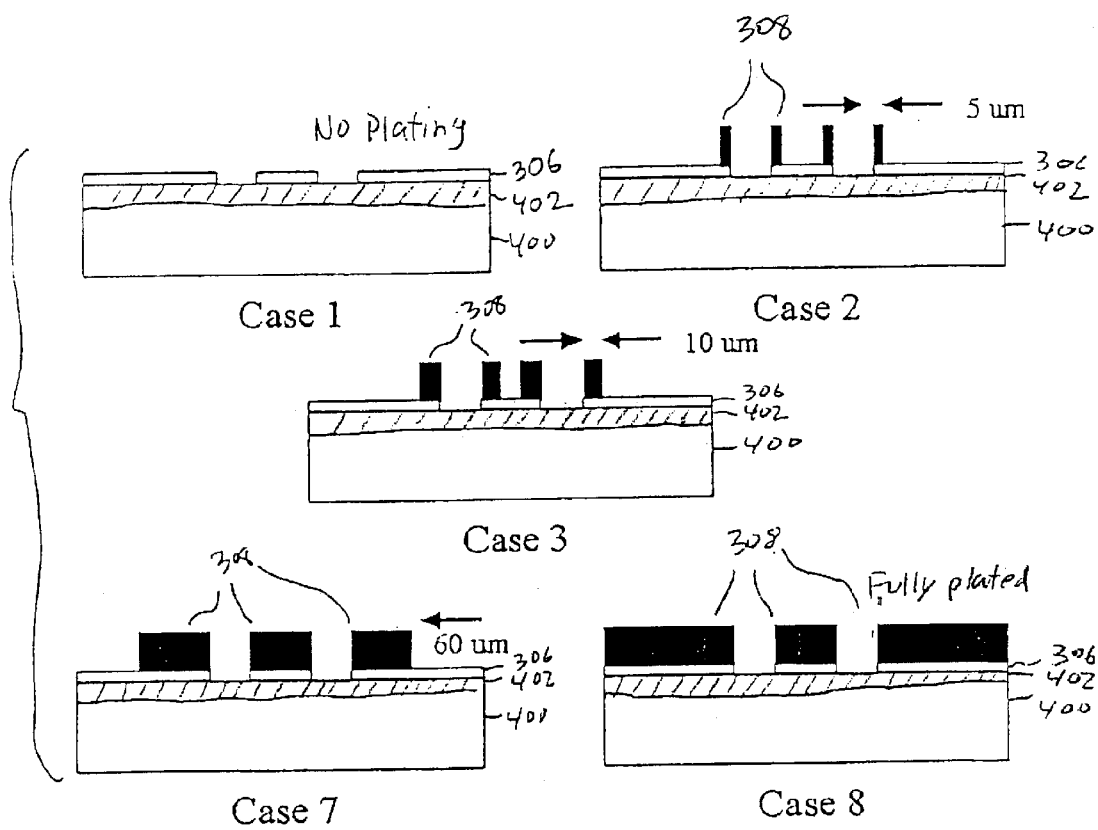
FIG. 5 shows four cases of conductor lines with various widths of edge plating conductor material.
Figure 6:
FIG. 6 is a graph illustrating performance verses various widths of edge plating ranging from no plating (case 1) to full plating (case 8).

Satisfactory performance of the edge plated transmission lines may be verified by electromagnetic (EM) computer simulation as shown in FIGS. 5 and 6. As demonstrated, while traditionally fully plated lines may offer the best performance, a good trade-off can be made between performance and cost.

Taking FIGS. 5 and 6 together, FIG. 5 shows several cases for various widths of edge plating conductor material, labeled case 1, case 2, case 3, case 7, and case 8. These cases coincide with the EM simulation graph shown in FIG. 6 which graphically illustrates performance for various widths of edge plating ranging from no plating (case 1) to full plating (case 8) for a 2 GHz signal carried by the transmission lines.

Referring to FIG. 5, the bottom conductor layer 306 and the seed layer 402 are shown on the a dielectric substrate 400. Case 1 illustrates the case when there is no transmission line edge plating 308 (i.e., sputtered or evaporated gold only). Case 2 illustrates the case when the edge plating 308 provided is 5 µm wide. Case 3 illustrates the case where 10 µm of edge plating 308 is provided. Case 7 illustrates the case where 60 µm of edge plating 308 is provided. Finally, case 8 illustrates the case where the edge plating 308 completely covers the bottom conductor layer 306, thus, the signal lines are fully plated (i.e., the conventional case where the sputtered or evaporated gold conductor lines are fully plated with gold).

The graph shown in FIG. 6 illustrates performance vs. plating width for eight cases, including the five cases illustrated in FIG. 5. As shown, when no plated Au is present on the conductor lines (case 1), a 2 GHz signal experiences a −1.4 dB/cm loss. At the opposite end of the scale when the conductor lines are fully plated (case 8), there is only a about a −0.4 dB/cm loss of a 2 GHz signal. This represents a 280% improvement over case 1. It is noted that for case 7 where there is only a 5 µm width of edge plating the loss is greatly improved from the −1.4 dB/cm measurement to −0.9 dB/cm. Similarly, in case 7 where 40% of the electroplated metal is removed vs. case 8, the performance degrades by only 15%.

Thus the inventive edge-plated transmission lines provide substantial performance improvements over sputtered lines of thin Au while saving significant amount of Au. In addition, edge plated transmission lines can be made while fabricating the integrated switches with no additional steps required. The performance of the edge plated lines is typically much better than those made of thin sputtered Au alone and substantial amounts of conductor material is saved thus greatly reducing costs. Further, embodiments of the present invention may apply to other types of planar transmission lines as well, such as microstrip and stripline transmission line devices.

Embodiments of the present invention are specifically illustrated and/or described herein. However, it will be appreciated that modifications and variations of the present invention are covered by the above teachings and within the purview of the appended claims without departing from the spirit and intended scope of the invention.

We claim:

1. A waveguide device, comprising
   a plurality of transmission lines positioned in parallel, said plurality of transmission lines comprising a first layer of conductor material;

a second layer of conductor material positioned atop edges of each of said plurality of transmission lines, a width of said second layer of conductor material being less than a width of said first layer of conductor material, said second layer extending vertically from said edges forming said transmission lines having one of a U-shaped cross-section and an L-shaped cross-section, wherein said first layer of conductor material and said second layer of conductor material each comprise at least one of Gold, Aluminum, Nickel, and Copper.

2. The waveguide device as recited in claim 1, wherein said plurality of transmission lines comprises:

a center signal line;

a first ground line positioned on a first side of said signal line; and a second ground line positioned on a second side of said signal line, wherein said second layer of conductor material is positioned atop both edges of said signal line and positioned atop said first and said second ground lines atop edges adjacent said signal line.

3. The waveguide device as recited in claim 2 further comprising:

a switch integral with said signal line.

4. The waveguide device as recited in claim 3 where in said switch comprises:

a cantilevered beam spanning a gap in said signal line.

5. The waveguide device as recited in claim 1 wherein said width of said second layer of conductor material is approximately 5 $\mu$m–60 $\mu$m wide.

6. The waveguide device as recited in claim 1 wherein said first layer of conductor material comprises sputtered gold and said second layer of conductor material comprises plated gold.

7. The waveguide device as recited in claim 1 wherein said first layer of conductor material comprises a sputtered conductor material.

8. The waveguide device as recited in claim 7 wherein said second layer of conductor material comprises a plated conductor material.

9. A coplanar waveguide, comprising:

a signal line having a U-shaped cross-section comprising a conductive base layer and conductive vertical edge portions;

a first ground line on a first side of said signal line having an L-shaped cross-section comprising a conductive base layer and a single vertical conductive edge portion on an edge adjacent to said signal line; and a second ground line on a second side of said signal line having an L-shaped cross-section comprising a conductive base layer and a single vertical conductive edge portion on an edge adjacent to said signal line, wherein each one of said conductive base layers comprise one of a sputtered and evaporated conductive material, and wherein said conductive material comprises at least one of Gold, Aluminum, Nickel, and Copper.

10. The coplanar waveguide as recited in claim 9 wherein each of said vertical conductive edge portions comprise a plated conductive material.

11. The coplanar waveguide are recited in claim 9 further comprising:

a switch integral with said signal line.

12. The coplanar waveguide as recited in claim 9 wherein a width of each of said vertical conductive edge portions is approximately 5 $\mu$m–60 $\mu$m wide.

* * * * *